United States Patent [19]
Bathey et al.

[11] Patent Number: 5,106,763
[45] Date of Patent: Apr. 21, 1992

[54] METHOD OF FABRICATING SOLAR CELLS

[75] Inventors: Balakrishnan R. Bathey, Andover; Mary C. Cretalla, Bedford; Aaron S. Taylor, Acton, all of Mass.

[73] Assignee: Mobil Solar Energy Corporation, Billerica, Mass.

[21] Appl. No.: 271,514

[22] Filed: Nov. 15, 1988

[51] Int. Cl.$^5$ ............................................. H01L 31/18
[52] U.S. Cl. ............................................ 437/2; 136/261; 156/606; 156/608; 156/DIG. 88; 148/DIG. 41; 148/DIG. 73; 357/20; 357/30; 437/116; 437/927
[58] Field of Search ............................. 437/2–5, 437/116, 927; 148/DIG. 41, DIG. 73; 156/605–606, 608, DIG. 88; 136/258 PC, 261; 357/20, 30 D, 30 J

[56] References Cited

U.S. PATENT DOCUMENTS

| | | | |
|---|---|---|---|
| 2,841,860 | 7/1958 | Koury | 437/116 |
| 2,854,363 | 9/1958 | Seiler | 437/116 |
| 3,134,906 | 5/1964 | Henker | 136/246 |
| 4,036,666 | 7/1977 | Mlavsky | 437/2 |
| 4,056,404 | 11/1977 | Garone et al. | 136/255 |
| 4,341,589 | 7/1982 | Grabmaier | 156/606 |
| 4,428,783 | 1/1984 | Gessert | 437/2 |
| 4,523,966 | 6/1985 | Tsuya et al. | 437/118 |

Primary Examiner—Aaron Weisstuch
Attorney, Agent, or Firm—Pandiscio & Pandiscio

[57] ABSTRACT

A method and apparatus for producing crystalline substrates for use in fabricating solid state electronic devices. A hollow crystalline body is grown from a melt containing a dopant and a P-N junction is formed in said crystalline body as it is being grown. Then the hollow body is severed to provide individual solar cell substrates.

35 Claims, 2 Drawing Sheets

METHOD OF FABRICATING SOLAR CELLS

This invention relates to the manufacture of solid state semiconductor devices. More particularly, the invention is directed to an improved process and apparatus for forming a junction in a solid state semiconductor device.

BACKGROUND OF THE INVENTION

Various methods are known in the art for growing crystalline bodies from a melt. For example, using the "EFG" process (also known as the "edge-defined, film-fed growth" process) disclosed in U.S. Pat. No. 3,591,348, issued to Harold E. LaBelle, Jr., it is possible to grow crystalline bodies of silicon or other materials in diverse shapes of controlled dimensions by means of so called capillary die members which employ capillary action for replenishing the melt consumed by crystal growth. Also, by introducing suitable conductivity type-determining impurities or dopants, to the melt, e.g., boron, it is possible to produce crystalline bodies by the aforesaid EFG process which have a P or N type conductivity and a predetermined resistivity. For silicon solar cells, it is preferred that the resistivity of such regions be held to less than about 100 ohm-cm and for best conversion efficiency between about 0.001 to about 10 ohm-cm.

P-N junctions are formed in such materials by introducing a selected impurity or dopant into the crystalline body, e.g., phosphine is introduced to form an N-type layer in boron-doped P-type silicon, whereby a P-N junction is created. Also in order to improve the efficiency of collecting the photoelectrically produced carriers in such solar cells, the depth of the P-N junction from the surface which is to serve as the radiation receiving surface is made small, preferably on the order of 0.5 micron.

Another process for growing crystalline bodies with controlled cross-sectional shapes is disclosed by U.S. Pat. No. 4,000,030 issued to Ciszek. In this patent, the method involves the use of a submerged projection extending above the level of the melt, with the crystal's growth occurring from a melt meniscus formed over the upper end of the projection.

As disclosed in U.S. Pat. No. 4,036,666 issued to Mlavsky it has been found that ribbons can be produced by growing a substantially monocrystalline tube and then slicing the tube lengthwise. The ribbons produced do not have the concentration of surface defects adjacent their edges as characterizes ribbons grown directly from the melt by EFG. The foregoing discovery and a succession of other discoveries has led to the growth of regularly shaped octagons or nonagons (i.e., hollow bodies with cross-sectional configurations in the shape of eight or nine sided polygons) as a preferred configuration. The polygons are later cut at their corners to produce flat ribbons.

In the formation of solar cells from P-type EFG-grown silicon ribbon, the ribbon is provided by growing it from a boron-doped, semiconductor grade silicon melt under an inert atmosphere of argon gas using the EFG process. With P-type ribbon, solar cell formation is typically achieved by introducing the ribbons into a diffusion furnace where they are exposed to phosphorous oxychloride under conditions conductive to diffusion of phosphorous into the surface of the ribbons so as to form a continuous N+ layer around the entire cross-section of the ribbons. Thereafter a silicon nitride or other anti-reflection coating is deposited on the front side of the ribbon substrate and electrodes are applied to both the front and rear sides of the ribbons, according to known techniques (see U.S. Pat. Nos. 4,451,969; 4,609,565; and 4,557,037).

In the typical diffusion type junction-forming operation, diffusion occurs on all surfaces of the substrate, including the sides and edges. Consequently, the cell edges have to be trimmed to eliminate a low resistance current path ("short circuit") between the front and rear sides of the solar cell and thereby conductively isolate the back of the cell from the front. Trimming may be accomplished by mechanically sawing off edge portions of the cells. More recently, lasers have been used to cut off the edges of the cells.

These techniques for isolating the backside of the cell are effective. However, diffusion and edge trimming are also costly and wasteful. Approximately 20-30% of the total cost of making a solar cell is incurred during these steps. Diffusion and edge trimming require a series of labor-intensive and materials-intensive operations, both of which contribute to yield losses. In addition to these expenses, the loss of the edges reduces the power producing area of the cell by nearly 5% and silicon trimmed from the cell is discarded as waste, which must be disposed of within the guidelines established by the government pollution control authorities.

Moreover, it is recognized by persons skilled in the art that widespread use of photovoltaic solar cells is dependent upon the development of fabrication techniques capable of producing reliable solar cells with a conversion efficiency of 12% or higher at a relatively low cost. The cost and saleability of solar cells, like other semiconductor devices, depends on (1) the cost of the starting materials, (2) the cost of converting the starting materials into the finished product, (3) the cost of disposing of waste materials, (4) the overall output of the cells, and (5) the yield of acceptable solar cells.

OBJECTS OF THE INVENTION

Accordingly, the basic object of this invention is to provide an improved low cost method and apparatus for making a solar cell junction by diffusion.

A further object of this invention is to provide a low cost processing sequence for the fabrication of solar cells in which the front and back surfaces are conductivity isolated without trimming the cell.

An additional primary object of the invention is to provide an improved low cost method of producing crystalline ribbons for use in fabricating solid state electronic devices in which the PN junction is formed during the growth of the crystalline body.

These and other objects of this invention are achieved by a method which involves the following steps: (a) growing from a melt a hollow body of a semiconductor material characterized by a first type of conductivity, and (b) forming a zone of opposite type conductivity and a photovoltaic junction near at least one surface of the newly grown monocrystalline body as the body is being grown. In the formation of solar cells, the hollow body is cut into a plurality of separate solar cell substrates ready for application of metal contacts. The invention also provides new apparatus for forming a junction in a hollow body as the latter is pulled from a melt.

These and various other features and advantages of the invention are disclosed by the following detailed description of the invention and the accompanying drawings.

BRIEF DESCRIPTION OF THE DRAWINGS

For a fuller understanding of the nature and objects of the present invention, reference should be made to the following detailed description which is to be considered together with the accompanying drawing wherein.

DETAILED DESCRIPTION OF THE INVENTION

For convenience, the following detailed description of the invention is directed to crystal growing apparatus for growing relatively large diameter hollow 8-sided crystalline bodies of P-type silicon. However, it is not intended that the invention be so limited, since similar crucible/die combinations may be provided for growing crystalline bodies of other materials, e.g., alumina, barium titanate, lithium niobate, or yttrium aluminum garnet. Also the crucible/die assembly may be shaped to grow hollow bodies of other cross-sectional shapes, e.g., hollow bodies having 4, 6, 7 or 9 sides, or even a hollow body of circular configuration. For convenience, an 8-sided hollow crystalline body is called an octagon, a nine-sided hollow crystalline body is called a nonagon, etc.

Figure 1:
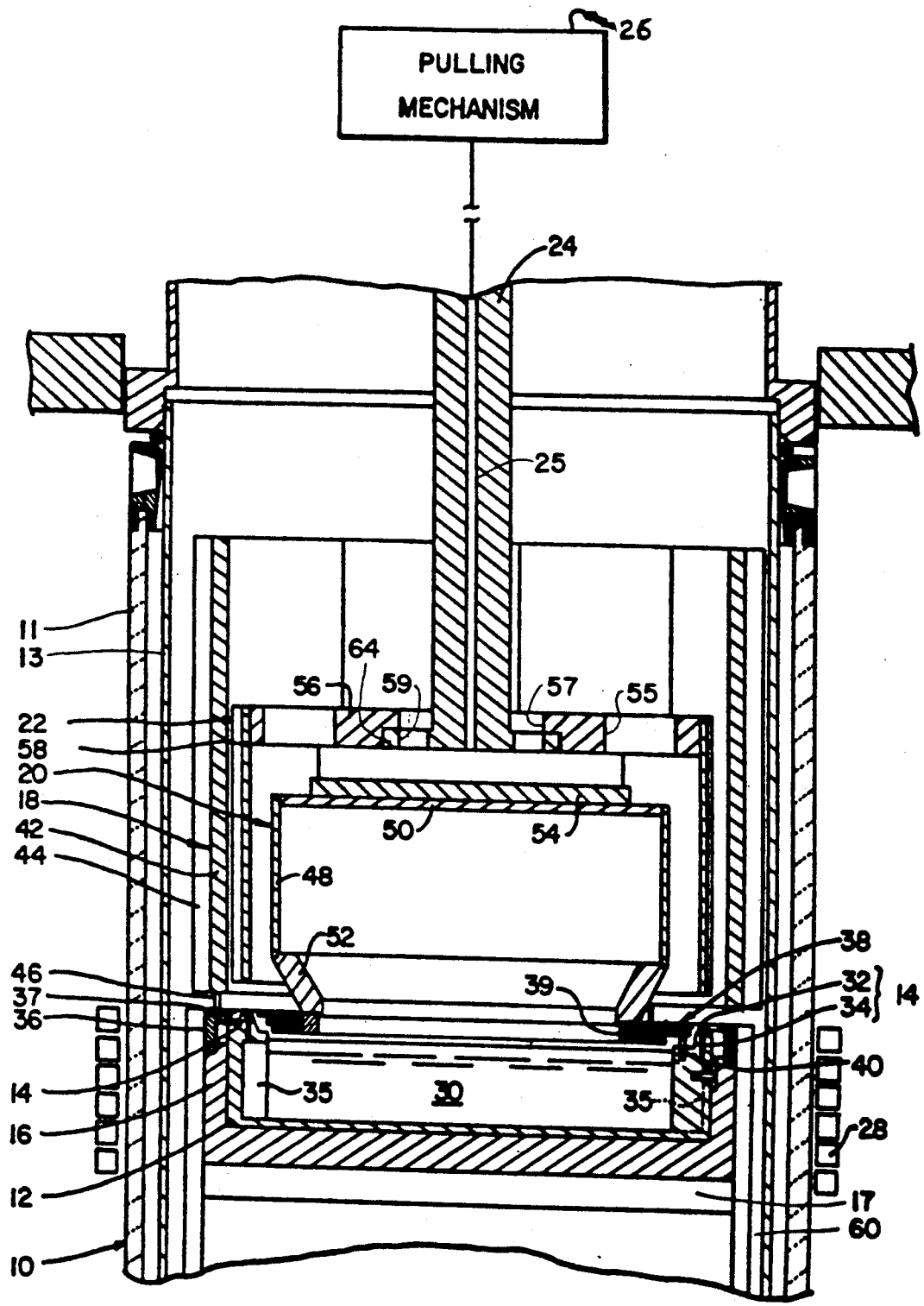
FIG. 1 illustrates prior art apparatus.

FIG. 1 shows a typical prior art crystal growing apparatus comprising a furnace enclosure 10, an EFG crucible/capillary die system comprising a crucible 12, a capillary die 14, a molybdenum or graphite susceptor 16, after-heater assemblies 18 and 20 and a seed assembly 22. As will be described in detail hereinafter, seed assembly 22 is positioned and supported by a stem 24 connected to a pulling mechanism 26. Preferably, furnace enclosure 10 is a double-walled structure comprising mutually spaced outer and inner walls 11 and 13. Furnace enclosure 10 is surrounded by a radio frequency heating coil 28 which is coupled to a controllable radio frequency power supply (not shown) of conventional construction. In use, crucible 12 is loaded with a charge 30 of the material to be grown (e.g., P-type silicon).

The furnace enclosure 10 is fabricated from a pair of concentric spaced-apart cylindrical quartz tubes 11 and 13. Although not shown in detail, it will be understood that, except for an opening at the top to permit removal of the growing crystalline body by the associated pulling mechanism, plus a port (not shown) at the bottom for introduction of a selected gas such as argon, furnace enclosure 10 is closed top and bottom to permit the atmosphere within the enclosure to be controlled. Crucible 12 is a short, hollow, open-topped right prism or right circular cylinder centrally disposed within enclosure 10. Capillary die 14 is an integral part of the sidewall of crucible 12, as detailed in U.S. Pat. No. 4,230,674 (see also U.S. Pat. Nos. 4,440,728 and 4,647,437 for related designs). As is well known in the art, capillary die 14 is provided with an end face or edge 32 (FIG. 1) shaped and dimensioned to control the form and size of the grown crystal. Preferably end face 32 is a hollow thin-walled regular polygon as viewed in plan view. End face 32 is provided with a capillary gap 34 of similar form centered in the end face. A plurality of elongate slots 35 are formed on the inside of the side wall of crucible 12 communicating between capillary gap 34 and the interior of the crucible, so that the melted charge 30 may flow into the capillary gap wherein it may rise by capillary action to replenish the material on end face 32 as the crystal is grown. It will be recognized by those skilled in the art that this is the arrangement of the embodiment illustrated in FIG. 6 of U.S. Pat. No. 4,230,674, although it will also be understood that die 14 could be formed separately from the crucible, as set forth, for example, in U.S. Pat. Nos. 3687,633 and 3,591,348.

The material of construction of crucible 12 (and die 14) is chosen on the basis of the material to be grown. In a preferred embodiment, silicon is grown, in which case it is preferred that crucible 12 and die 14 are formed of graphite and the seed is silicon. It will be understood that crucible 12 and die 14 could be separate parts of differing composition. For the purpose of the present invention, it should also be understood that end face 32 of die 14 need not be in the form of a regular polygon in plan view, or indeed polygonal, as long as it is in the form of a closed plane figure.

Susceptor 16 is typically a short hollow open-topped cylindrical or prismatic body dimensioned to accommodate crucible 12. Susceptor 16 is supported by a pedestal 17 attached to the lower end of furnace enclosure 10. The height of susceptor 16 is chosen to permit capillary die 14 to project upward beyond the top of susceptor 16. In the case of growing silicon bodies, susceptor 16 is fabricated of a material such as molybdenum or graphite, the choice in part depending upon the available excitation frequency of heating coil 28 (e.g., preferably molybdenum for frequencies in the vicinity of 10 KHz and graphite for frequencies in the vicinity of 8 KHz).

The top of susceptor 16 supports an outer radiation shield 36. Outer radiation shield 36 is in the form of a thin-walled hollow cylinder or prism of similar shape and outside dimension as susceptor 16 and with an interior flange 37 of similar form as end face 32 of capillary die 14. Outer radiation shield 36 is dimensioned and disposed such that flange 37 is substantially coplanar with but separated from end face 32. In growing silicon, it is preferred that the outer radiation shield be fabricated of molybdenum or graphite. Mounted to the interior of capillary die 14 is inner radiation shield 38. Inner radiation shield 38 is formed of one or more annular graphite plates held together in parallel spaced apart opposing relationship. The outside dimension of inner radiation shield 38 is of similar form as but smaller than the inside dimension of end face 32. Radiation shield 38 is supported in spaced-apart relationship from die 14 by a plurality of pins 40 disposed about the inner periphery of the die 14. Radiation shield 38 is provided with or defines a central circular aperture 39. In a preferred embodiment, inner radiation shield 38 is machined from a single piece of graphite, although it will be understood it could be fabricated from a number of sheets fastened together.

A pair of after-heaters 18 and 20 are disposed above and in concentric relation to die end face 32. After-heater 18 is disposed outside of the die face, while after-heater 20 is disposed inside. After-heater 18 is of hollow, open ended right prismatic form, its base being similar in configuration to die end face 32. The corresponding faces or sides of after-heater 18 are arranged parallel to the corresponding sides of the octagon formed by end face 32 and extend substantially normal to the plane of the end face. After-heater assembly 18 is a double walled structure, with a graphite interior wall 42 and an external carbon felt insulating wall 44. After-heater 18 is supported and separated from flange 37 on outer radiation shield 36 by a plurality of pins 46.

Hollow inner after-heater 20 includes a cylindrical wall 48, top plate 50 and tapered section 52. Cylindrical wall 48 is a thin-walled hollow graphite right circular cylinder of smaller outside diameter than the circle which can be inscribed within the plan or cross-sectional configuration of end face 32 of die 14. Preferably, top plate 50 is a circular graphite plate dimensioned to fit and close off one end of cylindrical wall 48. Tapered section 52 is in the form of a hollow-open ended conical frustrum attached by its larger base to the other end of cylindrical wall 48. The smaller base of tapered section 52 is chosen to be of similar diameter as circular aperture 39 in inner radiation shield 38. With the exception of the top of inner after-heater 20, the walls of each section are single. The top of inner after-heater 20 is of double-walled construction, top plate 50 supporting a somewhat smaller diameter carbon felt insulation pad 54. Inner after-heater 20 is supported on the top of inner radiation shield 38 by tapered section 52 such that the interior of the after-heater communicates with the interior of crucible 12 through aperture 39 in radiation shield 38. Cylindrical section 48 of the inner after-heater 20 is disposed with its cylindrical axis substantially normal to the plane of end face 32.

Seed assembly 22 comprises a seed holder 56 and a seed 58. Seed holder 56 is a plate, preferably of graphite, of similar size and shape as the inside periphery of end face 32 of die 14. Seed holder 56 surrounds and rests on a flange 64 on stem 24. Seed holder 56 has a plurality of openings 55 and 57 and flange 64 has openings 59 that communicate with holes 57. These holes permit flow of gas upwardly within the growing hollow body. Stem 24 has a passageway 25 for introducing a gas into the space surrounded by seed 58 and the growing hollow body via openings 55, 57 and 59.

Seed 58 is eight-sided and may constitute a short length of a crystalline body previously grown according to this invention; alternatively seed 58 may be formed from a polygonal array of a plurality of rectangular sheets or ribbons having a thickness on the order of, but typically somewhat greater than, the thickness of the desired grown crystal.

A further description of the structural details of a seed assembly can be found in U.S. Pat. Nos. 4,440,728 and 4,544,528 issued to Stormont et al.

Initially, stem 24 is affixed by any one of a number of conventional clamping means (not shown) to pulling mechanism 26, the whole being adjusted to support seed holder 56 and seed 58 so that the side walls of seed 58 are coaxial with and in opposing parallel relationship to corresponding faces of inner after-heater 20 and outer after-heater 18. From this position, pulling mechanism 26 may be extended, lowering stem 24 and seed holder 56 toward crucible 12 and lowering seed 58 toward die end face 32.

To initiate the growth sequence pulling mechanism 26 is used to lower seed 58 into contact with die end face 32 before seed holder 56 contacts insulation pad 54 atop after-heater 20. Seed 58 is now in position to initiate growth. If die end face 32 is heated above the melting point of the material of seed 58, the portion of the seed contacting the die end face will melt, wetting the end face and flowing into capillary gap 34. Pulling mechanism 26 is activated to raise stem 24 and the captivated seed assembly 22. As seed 58 rises from the die, the melted seed material wetting the die end face is drawn out, by surface tension, into a thin film between the seed and the die end face. Previously melted charge 30 rises by capillary action to replenish the material on the die end face. The molten charge 30 is maintained at a temperature of about 30 degrees C. above its melting point, while the temperature at die end face 32 is kept at a temperature at about 20 degrees C. above the melting point.

Seed 58 is pulled away from die end face 32 at a selected pulling speed, e.g., about 1.8 cm./minute. The pulling speed is set according to the rate at which the latent heat of fusion is removed from the ribbon at the crystallization front, i.e., the interface between the growing ribbon and the melt film at the upper end face 32 of the die/crucible assembly. A crystal is continuously grown on seed 58 at the upper end of the die/crucible assembly and the melt consumed in formation of the silicon body is replaced by upward flow of the melt from the crucible via the capillary.

Thermal control of the growing crystal is provided by RF heater 28 and after-heaters 18 and 20. In part, after-heaters 18 and 20 are heated by radiation from the growing crystal. Further, inner after-heater 20 receives radiation from the melt through aperture 39 in inner radiation shield 38. After-heaters 18 and 20 are also, in effect, susceptors, and are heated in part by radio-frequency radiation from coil 28. In addition to energy transfer by radiation, after-heaters 18 and 20 and the growing crystal are also cooled by convection. It will also be understood by those skilled in the art that the vertical march of temperature on the growing crystal may be controlled by such means as the disposition of the after-heaters 18 and 20, the size of aperture 39, and the amount of insulation afforded by carbon felt walls 44 and 54. In particular, the decreasing clearance between tapered section 52 and the growing crystal can be used to provide a growing zone of substantially constant temperature in the vicinity of the end face 32.

According to the usual mode of operation of growing crystals by the EFG process herein above described, argon gas (usually but not necessarily containing a small amount of oxygen) is passed upward in the furnace on a continuous basis at relatively high rates (calculated to provide between about 15-25 volume changes of gas per hour) via an annular passageway 60 that surrounds the outside wall of crucible 12 into the region of the liquid/solid interface, which is sometimes referred to as the "growth zone". Passageway 60 communicates with a gas inlet port (not shown) in the lower end of furnace enclosure 10. The gas rate is generally calculated so as not to disturb the crystallization front while assuring that any volatile impurities in the region of the growth zone will be swept out of the furnace so as to reduce the likelihood of the same being picked up by the growing crystal. The gas is generally introduced at room temperature and flows upward from passageway 60 between pins 46 into the space between seed 58 and outer after-heater 18. The gas is then conveyed out of the top end of the furnace. The gas tends to have the added effect of causing some cooling of the growing crystal. To the extent already described, the apparatus of FIG. 1 is similar to the apparatus illustrated and described in U.S. Pat. No. 4,544,528, issued Oct. 1, 1985 to Richard W. Stormont et al. Additional gas flow within the seed and the growing crystalline body is achieved by passing gas into the furnace via passageway 25 as previously discussed.

The essence of the present invention is to deliberately introduce impurities into the growth zone and cause them to deposit and diffuse into the surface of the growing crystal to form a P-N junction. Since the crystal grown from boron-doped charge 30 will be P-type silicon, an opposite conductivity type dopant is required to be diffused into the growing body to form a P-N junction. This is accomplished by disposing a solid source of a selected dopant such as phosphorous, in position to vaporize and diffuse into the growing crystal so as to form an N-type region of shallow depth in the growing crystal while it is still in the furnace. By way of example but not limitation, the dopant source may be a silicon carbide sponge containing silicon pyrophosphate, i.e., $SiP_2O_7$ or a glass such as aluminum metaphosphate, i.e., $Al(PO_3)_3$.

Figure 2:
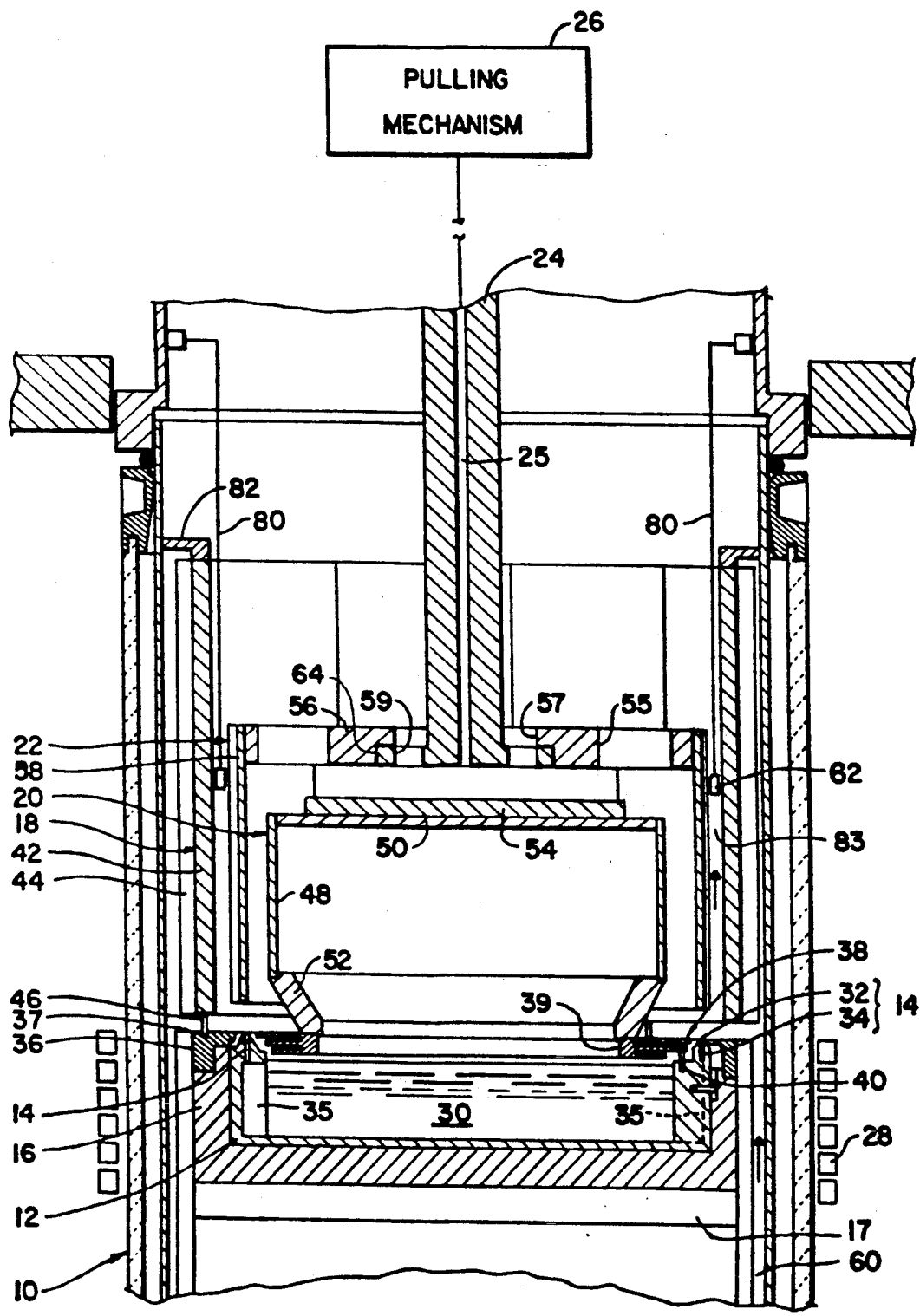
FIG. 2 is a longitudinal sectional view of a preferred form of EFG apparatus utilized in growing hollow silicon bodies according to this invention.

Referring now to FIG. 2, the furnace shown therein is exactly as described in the prior art furnace of FIG. 1, except that a dopant source 62 is attached to a graphite holder 80. The latter is adjustably secured to the wall 11 of furnace enclosure 10 so as to permit dopant source 62 to be moved up or down parallel to the axis of stem 24. Preferably dopant source 62 is attached to the bottom end of holder 80 as shown in FIG. 2 so as to maximize its exposure to the growing crystalline body. The solid phosphorous dopant source is positioned above but close to the liquid/solid growth interface. Argon gas is introduced into the furnace enclosure below the crucible and is directed so as to flow upwardly in passageway 60 between the susceptor and the inner wall 13 of the furnace chamber. As demonstrated by the arrows in FIG. 2, the argon gas flows up along the outer surface of the crucible susceptor and then flows up along both sides of dopant source 62 and its holder 80 between the growing crystalline body and the outer after-heater. A baffle 82 is preferably interposed between outer after-heater 18 and the interior furnace wall 13 so as to limit or totally prevent upward flow of argon gas between the outer after-heater and wall 13, thereby forcing the upwardly flowing gas to pass between the upper end of susceptor 16 and the lower end of the outer after-heater into the annular space 83 between the outer after-heater and the crystalline body growing on seed 58. Concurrent flow of argon gas upwardly along the inner side of the growing crystalline body is achieved by introducing a stream of gas into passageway 25. Some of that inner stream of gas flows down between radiation shield 38 and the upper end of the die/crucible assembly so as to cover the upper surface of melt 30. However, most of that inner stream flows upwardly via holes 55, 57 and 59 so as to contact the inner surface of seed 58 and the growing crystalling body.

In growing a hollow silicon body, e.g., a nonagon, the temperature at the upper end of the EFG die is kept at about 1200 degrees C., with the temperature along the growing body decreasing with increasing distance from the growth interface. The dopant source is positioned at a height where the temperature is sufficient to drive the dopant out of the source and cause it to diffuse into the growing P-type silicon body. The rate of diffusion of the dopant into the silicon body is controlled in part by the temperature in the region of the dopant source and also by the pulling speed of the growing body. The higher the dopant source is positioned relative to the height of the growth interface, the lower the driving temperature available for diffusion and the lower the rate of diffusion of phosphorous into the silicon body. Preferably the dopant source is positioned at a height where the average temperature is between about 975 and 1100 degrees C. While the rate of gas flow past the growing silicon body has some effect on the diffusion rate, that effect is not significant in comparison to the temperature of the dopant source and the pulling speed. Furthermore, upward flow of the inert purge gas will prevent the dopant from contaminating the silicon melt when using continuous melt replenishment.

As a consequence of this step, phosphorous is diffused into the outside surface of the P-type crystalline body so as to form a relatively shallow N region or zone. Typically the N-type region will have a depth of between 0.3 and 0.7 microns.

Thereafter the hollow body is cut into ribbons. The ribbons require no further trimming since the P-N junction has been formed on only one side.

The ribbons may be cut in any of a variety of ways well known in the art. For example, a laser cutting tool may be used to subdivide the hollow octagon. Another possible method is by etching. One etch cutting technique involves coating the outer surface of each side of the silicon body with a conventional positive resist material, exposing straight and narrow longitudinally-extending portions of the resist layer to a narrow beam of light, developing the resist using a preferential solvent or etchant such as methyl isobutyl ketone so that the unexposed portions of the resist coating remain intact while the exposed areas are dissolved away to expose narrow line portions of each side wall of the silicon body, and then applying a silicon etchant to the hollow body so as to subdivide it along its exposed areas. KOH or a mixture of one part HF and three parts $HNO_3$ may be used as the silicon etchant. The excision of the silicon body is followed by rinsing the resulting ribbons with distilled water and then removing residual resist coating with a suitable solvent such as trichloroethylene. Thereafter, the ribbons may be used to form solar cells.

To make a solar cell requires the final step of applying electrodes to the opposite sides of ribbon. The electrodes are formed by a conventional metallization technique. Preferably, but not necessarily, the metallization involves coating the entire expanse of the P-conductivity side of the ribbon with a continuous adherent coating of aluminum, then coating both the N and P sides of the ribbon with one or more layers of nickel, and thereafter over-coating the nickel layers with successive layers of copper and tin. The electrode formed on the N-conductivity side of the ribbon has the form of a multi-fingered grid, e.g., in the pattern shown in U.S. Pat. No. 3,811,954, so that a major portion of that surface is uncovered and exposed to receive solar radiations. The resulting structure is a solar cell with a substantially planar P-N junction that lies close to the upper surface of the cell and electrodes for coupling the cell into an electrical unit. By way of example, the electrodes may be formed according to the process described in U.S. Pat. No. 4,321,283 issued Mar. 23, 1982 to Kirit B. Patel et al, or the process described in U.S. Pat. No. 4,451,969 issued June 5, 1984 to Arup R. Chaudhuri.

Following is an example of how to practice the invention according to a preferred embodiment of the invention.

EXAMPLE

The crucible and die arrangement shown in FIG. 2 is used to produce a P-type silicon hollow octagon with a wall width of about 10.2 cm (about 4 inches) and a wall thickness of about 0.25 cm (about 0.010 inch). A solid phosphorous doping source in the form of a silicon carbide sponge containing silicon pyrophosphate ($SiP_2O_7$) is provided at 62. Source 62 is positioned between the silicon seed and the outer after-heater at a selected level so that the solid phosphorous experiences in excess of 1000 degrees C. as a silicon body is being grown onto the seed. Argon gas is fed into the passageways 60 and 25 at a rate of 8 liters/min. and 14 liters/min., respectively, to prevent phosphorous from diffusing into the melt. The melt contains boron doped silicon and the hollow octagon is grown according to the EFG process by drawing the melt up from surface 32. The molten silicon charge 30 in the crucible is maintained at a temperature of about 30 C. degrees above its melting point and the temperature of the upper end face 32 of die 14 is kept at about 20 degrees above the melting point of silicon. The seed is contacted with the upper end face 32 of die 14 long enough to form a film of melt, and then the seed is withdrawn to permit crystal growth to occur. Once growth has commenced the pulling speed is held at about 1.8 cm/minute. Growth continues until substantially all the silicon within the crucible is consumed. The rate of flow of argon gas is then increased to prevent additional diffusion of phosphorous into the silicon octagon. An N-type layer or zone is formed to a depth of about 0.3 microns beneath the octagon's surface.

It is to be understood that the term "crystalline body" as used herein is intended to embrace a crystalline body of a semiconductor material that is polycrystalline or is comprised of a single crystal or two or more crystals, e.g., a bicrystal or tricrystal, growing together longitudinally but separated by a relatively small angle (i.e., less than about 4 degrees) grain boundary.

Of course, the invention may be practiced by using N-type silicon and a P-type source so as to introduce a P-type layer or zone to the silicon, thereby providing a useful P-N junction.

Liquid dopants also may be used. In such use a porous reticulated vitreous carbon may be incorporated with liquid dopant. The latter approach is attractive because of the possibility that the liquid dopants can be replenished with ease in this material.

As a further possible modification, the crucible may be provided with a hollow center riser to define a passageway whereby additional silicon may be supplied to replenish melt 30. The latter form of crucible and a suitable mechanism for feeding additional source material to the crucible are shown in U.S. Pat. No. 4,661,324. A gas such as argon, or argon mixed with oxygen, may be supplied to the crucible via the center riser, and such gas will flow up out of the crucible into the space between seed 58 and the inner after-heater, with that gas flow occurring through holes 55, 57 and 59.

Since changes may be made in the above processes without departing from the scope of the invention herein involved, it is intended that all matter contained in the above description or shown in the accompanying drawing shall be interpreted as illustrative. The present invention is indicated by the broad general meaning of the terms in which the appended claims are expressed.

What is claimed is:

1. A method of producing silicon crystalline bodies having a photovoltaic junction comprising:
   (a) growing from a melt contained in a crucible a hollow crystalline body of silicon characterized by a first type of conductivity, said hollow body having inner and outer major surfaces;
   (b) providing a solid source of a dopant of a second, opposite type of conductivity in a region located downstream of the melt/crystalline body interface; and
   (c) diffusing said dopant from said source into one of said major surfaces of said growing crystalline body so as to form a zone of said second, opposite type of conductivity and a photovoltaic junction near said one major surface of said growing crystalline body.

2. Method according to claim 1 further including the step of cutting said crystalline body into discrete substrates.

3. The method of claim 1 wherein said zone of second, opposite type conductivity is formed by diffusion from a dopant source located proximate to an after-heater that surrounds said hollow crystalline body.

4. The method of claim 1 wherein a zone of first type conductivity is formed on the inner surface of said hollow crystalline body.

5. The method of claim 1 wherein said zone of second, opposite type conductivity is formed on only the inner surface of said hollow crystalline body.

6. The method of claim 1 wherein a zone of first type conductivity is formed on the outer surface of said hollow crystalline body.

7. The method of claim 1 wherein said dopant is a phosphorous compound and is contained in a solid located between an after-heater and said crystalline body as it is being grown.

8. The method of claim 1 wherein said dopant is a liquid.

9. The method of claim 1 wherein said dopant is contained in reticulated vitreous carbon located adjacent an after-heater.

10. The method of claim 1 which further comprises:
    (c) forming a protective film on the surface of said crystalline body;
    (d) removing selected portions of said film; and
    (e) severing said crystalline body by etching it where the selected portions of said film were removed.

11. The method of claim 1 wherein said zone of opposite conductivity is formed by diffusion of a dopant from a dopant source located above the melt/crystalline body interface, and the rate of diffusion of said dopant into said surface of said body is controlled in part by regulating the position of the dopant source relative to said growth interface.

12. The method of claim 11 wherein an inert gas such as argon flows past said hollow body as it grows.

13. The method of claim 1 wherein said body is grown by the EFG process.

14. The method of claim 1 wherein the forming of said zone of second, opposite type conductivity is accomplished at a temperature in excess of 900° C.

15. The method of claim 1 wherein said body comprises P-type silicon.

16. The method of claim 15 wherein said P-type silicon is boron doped silicon.

17. The method of claim 15 wherein said zone of second, opposite type conductivity is formed using phosphorous.

18. The method of claim 1 wherein said body is N-type silicon.

19. The method of claim 1 wherein said body has a polygon-shaped cross-section.

20. The method of claim 19 wherein said polygon-shaped cross-section is an octagon or a nonagon.

21. A method of making a solar cell, comprising the steps of:
   (a) growing from a growth interface located above a melt contained in a crucible a hollow crystalline body of a semiconductor material characterized by a first type of conductivity;
   (b) forming a zone of opposite type conductivity and a photovoltaic junction near one surface of said crystalline body as said crystalline body is growing from said melt, said zone of opposite conductivity being formed by diffusion of a dopant from a dopant surface located above the growth interface, and the rate of diffusion of said dopant into said surface of said body being controlled in part by regulating the position of the dopant source above the growth interface; and
   (c) forming electrodes on two surfaces of said crystalline body on opposite sides of said photovoltaic junction.

22. The method of claim 21 wherein said step of forming electrodes is accomplished by the steps of:
   coating said body of first type conductivity with a continuous adherent coating of aluminum;
   coating said coating of aluminum and said zone of opposite type conductivity with one or more layers of nickel; and
   over-coating said nickel layer with successive layers of copper and tin.

23. The method of claim 21 wherein nickel is coated on said zone of opposite type conductivity in the form of a multi-fingered grid.

24. The method of claim 22 wherein said step of forming a zone of opposite type conductivity is accomplished by diffusion from a dopant source located in an after-heater.

25. The method of claim 21 further comprising the step of:
   cutting said crystalline body into discrete substrates prior to said step of forming electrodes.

26. A method of producing crystalline bodies having a photovoltaic junction, comprising:
   (a) growing from a growth interface located above a melt of a semiconductor material a first conductivity-type hollow crystalline body of said semiconductor material having inner and outer major surfaces; and
   (b) drawing said newly grown crystalline body through a zone containing a dopant source under temperature conditions and for a time such that said dopant is vaporized and diffuses into one major surface of said crystalline body so as to form a photovoltaic junction adjacent said one major surface.

27. The method of claim 26 further comprising the steps of flowing an inert gas through said zone in a direction away from said growth interface.

28. The method of claim 26 wherein said crystalline body is boron-doped P-type silicon and said dopant source comprises a silicon carbide sponge containing silicon pyrophosphate or aluminum metaphosphate.

29. The method of claim 26 wherein said dopant source is a porous reticulated vitreous carbon saturated with a suitable liquid dopant.

30. The method of claim 26 wherein said dopant source is heated to a vaporizing temperature by disposing it adjacent said crystalline body at a location above said growth interface.

31. The method of claim 26 further including the step of locating a supplemental heating means adjacent said dopant source.

32. The method of claim 31 wherein said supplemental heating means comprises an after-heater on the side of said dopant source opposite said one surface of said crystalline body.

33. The method of claim 32 wherein said supplemental heating means comprises an R-F susceptor.

34. The method of claim 26 wherein said crystalline body comprises a hollow tubular structure having a polygonal cross-section, and further comprising use of a hollow, open-ended afterheater disposed in surrounding and spaced relation to the outer surface of said crystalline body, said source of dopant being located between said crystalline body and said after-heater.

35. A method of growing hollow crystalline bodies by the EFG process, comprising the steps of:
   (a) providing an EFG apparatus comprising a crucible for containing a melt of semiconductor material and a die having a polygonal or cylindrical edge configuration;
   (b) contacting the upper edge of said die with a seed to initiate growth of a hollow crystalline body having a cross-sectional configuration conforming to that of the edge configuration of said die;
   (c) growing a hollow crystalline body conforming to the edge configuration of said die by gradually drawing said seed away from said die;
   (d) diffusing a dopant into one surface of said hollow crystalline body in a region upstream from said die so as to cause said dopant to diffuse into said one surface of said body so as to form a p-n junction therein.

* * * * *

UNITED STATES PATENT AND TRADEMARK OFFICE
CERTIFICATE OF CORRECTION

PATENT NO. : 5106763
DATED : 4/21/92
INVENTOR(S) : B.R. Bathey et al It is certified that error appears in the above-identified patent and that said Letters Patent is hereby corrected as shown below:

Claim 21, column 11, line 18, the word "surface"
should be changed to -- source --.

Claim 23, column 11, line 35, the numeral "21" should
be changed to -- 22 --.

Signed and Sealed this

Fifteenth Day of June, 1993

Attest:

MICHAEL K. KIRK

*Attesting Officer*      Acting Commissioner of Patents and Trademarks